(12) United States Patent
Ji

(10) Patent No.: US 11,699,496 B2
(45) Date of Patent: Jul. 11, 2023

(54) ANTI-FUSE MEMORY CIRCUIT

(71) Applicant: CHANGXIN MEMORY TECHNOLOGIES, INC., Anhui (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 22 days.

(21) Appl. No.: 17/674,882

(22) Filed: Feb. 18, 2022

(65) Prior Publication Data

US 2023/0012334 A1 Jan. 12, 2023

Related U.S. Application Data

(63) Continuation of application No. PCT/CN2021/120303, filed on Sep. 24, 2021.

(30) Foreign Application Priority Data

Jul. 8, 2021 (CN) .......................... 202110773222.7

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ...................................... G11C 17/18
USPC ........................................... 365/96
See application file for complete search history.

(56) References Cited

U.S. PATENT DOCUMENTS

| 7,046,569 | B2* | 5/2006 | Ito | ........................... | G11C 17/18 365/230.03 |
| 7,269,047 | B1* | 9/2007 | Fong | ....................... | G11C 16/28 365/189.16 |
| 7,599,206 | B2 | 10/2009 | Nakayama | | |
| 7,920,401 | B2* | 4/2011 | Xu | ........................... | G11C 17/18 365/96 |

(Continued)

FOREIGN PATENT DOCUMENTS

| CN | 101145575 A | 3/2008 |
| CN | 103578559 B | 5/2019 |

(Continued)

*Primary Examiner* — Muna A Techane
(74) *Attorney, Agent, or Firm* — Cooper Legal Group, LLC

(57) ABSTRACT

An anti-fuse memory circuit includes: a memory array including multiple anti-fuse memory cells; bit lines, each connected to the anti-fuse memory cells arranged in extension direction of the bit line, each anti-fuse memory cell being electrically connected to respective one of bit lines through first switch transistor; word lines, each connected to first switch transistors arranged in extension direction of word line; a second switch transistor connects one of the bit lines to transmission wire; a reading circuit, having first input terminal connected to the transmission wire, second input terminal for receiving reference voltage, and sampling input terminal for receiving sampling signal; and a signal generation circuit for generating sampling signal according to precharge voltage and precharge signal, where precharge signal is used for instructing to precharge transmission wire to precharge voltage, and delay duration between sampling signal and precharge signal is positively correlated with voltage amplitude of precharge voltage.

15 Claims, 8 Drawing Sheets

(56) References Cited

U.S. PATENT DOCUMENTS

| 8,767,433 B2* | 7/2014 | Kurjanowicz | G11C 17/16 365/96 |
|---|---|---|---|
| 2009/0027973 A1* | 1/2009 | Nakayama | G11C 17/18 365/207 |
| 2013/0077381 A1* | 3/2013 | Kwon | H10N 70/231 257/E47.001 |
| 2014/0340955 A1* | 11/2014 | Wu | G11C 17/16 365/104 |
| 2016/0276023 A1* | 9/2016 | Chen | G11C 16/26 |
| 2017/0125121 A1* | 5/2017 | Chen | G11C 7/062 |

FOREIGN PATENT DOCUMENTS

| CN | 112582013 A | 3/2021 |
|---|---|---|
| EP | 3926634 A1 | 12/2021 |

* cited by examiner

ANTI-FUSE MEMORY CIRCUIT

CROSS-REFERENCE TO RELATED APPLICATIONS

This application is a continuation of International Application No. PCT/CN2021/120303, filed on Sep. 24, 2021, which claims priority to Chinese Patent Application No. 202110773222.7, filed on Jul. 8, 2021. The disclosures of International Application No. PCT/CN2021/120303 and Chinese Patent Application No. 202110773222.7 are hereby incorporated by reference in their entireties.

TECHNICAL FIELD

The disclosure relates to but is not limited to an anti-fuse memory circuit.

BACKGROUND

An anti-fuse memory may be implemented through an array of anti-fuse memory cells. Gate oxygen media of the anti-fuse memory cells are broken down after a high voltage is applied, and an impedance of a path decreases after the breakdown. Information stored in the anti-fuse memory cells may be read by detecting a path resistance state after the breakdown.

However, an internal power voltage $V_{DD}$ of a device fluctuates. For example, a high voltage of $V_{DD}$ may reach 1.4 V, and a low voltage may reach only 1.0 V. In this case, if a reference voltage remains unchanged, when $V_{DD}$ is a high voltage, the anti-fuse memory cell that originally outputs a low level may finally read a high level, causing a read error.

SUMMARY

Embodiments of the disclosure provide an anti-fuse memory circuit, including: a memory array, including a plurality of anti-fuse memory cells, the anti-fuse memory cell representing stored 1-bit data by whether a gate oxide layer is broken down; bit lines, each of which is connected to the anti-fuse memory cells arranged in an extension direction of the bit line, each anti-fuse memory cell being electrically connected to a respective one of the bit lines through a first switch transistor; word lines, each of which is connected to the first switch transistors arranged in an extension direction of the word line and configured to turn on a selected first switch transistor according to a row strobe signal, where the extension direction of the bit line and the extension direction of the word line are perpendicular to each other; a second switch transistor, configured to connect one of the bit lines to a transmission wire; a reading circuit, including a first input terminal, a second input terminal and a sampling input terminal, where the first input terminal is connected to the transmission wire, the second input terminal is configured to receive a reference voltage, and the sampling input terminal is configured to receive a sampling signal; and a signal generation circuit, configured to generate the sampling signal based on a precharge voltage and a precharge signal, where the precharge signal is used for instructing to precharge the transmission wire to the precharge voltage, and a delay duration between the sampling signal and the precharge signal is positively correlated with a voltage amplitude of the precharge voltage. When the sampling signal is a valid pulse, the reading circuit compares an input voltage of the first input terminal with the reference voltage, to output 1-bit data stored in the anti-fuse memory cell.

DETAILED DESCRIPTION

Figure 1:
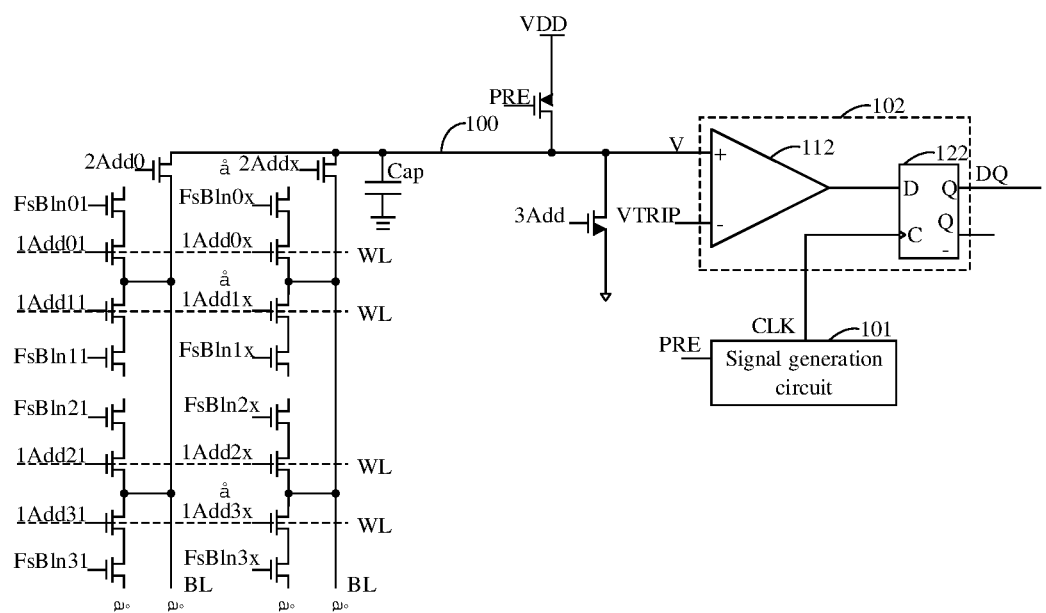
FIG. 1 is a schematic diagram of a circuit structure of an anti-fuse memory circuit according to an embodiment of the disclosure.

An anti-fuse memory is implemented through an anti-fuse memory array. The anti-fuse memory array includes a plurality of anti-fuse memory cells. A gate oxygen medium of the anti-fuse memory cell is broken down after a high voltage is applied, and an impedance of a path decreases after the breakdown. Therefore, information stored in the anti-fuse memory cell may be read by detecting a path resistance state after the breakdown.

Specifically, in a read phase, when the anti-fuse memory cell is broken down, the impedance of the path decreases, and after the anti-fuse memory cell is activated by a bit line and a word line, electric charges after a transmission line is precharged can be quickly discharged, so that data is read to a low level. In addition, when the anti-fuse memory cell is not broken down, the impedance of the path is extremely large, and after the anti-fuse memory cell is activated by the bit line and the word line, a discharge rate of electric charges after the transmission line is precharged is slow, so that data is read to a high level.

Therefore, when data programming is performed on the anti-fuse memory, the anti-fuse memory cell that is broken down after the application of the high voltage is represented as memory data "0", and an anti-fuse memory cell that is not applied with the high voltage is represented as memory data "1".

However, an internal power voltage $V_{DD}$ of a device fluctuates. For example, a high voltage of $V_{DD}$ may reach 1.4 V, and a low voltage may only reach 1.0 V. The internal power voltage $V_{DD}$ serves as a precharge voltage when data is read. In this case, if a reference voltage read from the data remains unchanged, when $V_{DD}$ is a high voltage, the anti-fuse memory cell that originally outputs a low level may finally read a high level, causing a read error.

To resolve the foregoing problem, embodiments of the disclosure provide an anti-fuse memory circuit, including: a memory array, including a plurality of anti-fuse memory cells, the anti-fuse memory cell representing stored 1-bit data by whether a gate oxide layer is broken down; bit lines, each of which is connected to the anti-fuse memory cells arranged in an extension direction of the bit line, each anti-fuse memory cell being electrically connected to a respective one of the bit lines through a first switch transistor; word lines, each of which is connected to the first switch transistors arranged in an extension direction of the word line and configured to turn on a selected first switch transistor according to a row strobe signal, the extension direction of the word line and the extension direction of the bit line being perpendicular to each other; a second switch transistor, configured to connect one of the bit lines to a transmission wire; a reading circuit, including a first input terminal, a second input terminal and a sampling input terminal, the first input terminal being connected to the transmission wire, the second input terminal being configured to receive a reference voltage, and the sampling input terminal being configured to receive a sampling signal; and a signal generation circuit, configured to generate the sampling signal based on a precharge voltage and a precharge signal. The precharge signal is used for instructing to precharge the transmission wire to the precharge voltage, and a delay duration between the sampling signal and the precharge signal is positively correlated with a voltage amplitude of the precharge voltage. When the sampling signal is a valid pulse, the reading circuit compares an input voltage of the first input terminal with the reference voltage, to output the 1-bit data stored in the anti-fuse memory cell.

A person of ordinary skill in the art may understand that in the embodiments of the disclosure, many technical details are proposed to make readers better understand the disclosure. However, even without these technical details and various changes and modifications based on the following embodiments, the technical solutions set forth in the disclosure can be implemented.

Figure 2:
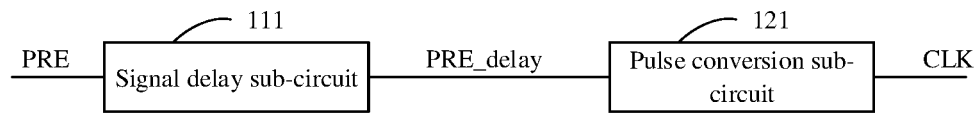
FIG. 2 is a schematic structural diagram of a signal generation circuit according to an embodiment of the disclosure.
Figure 3:
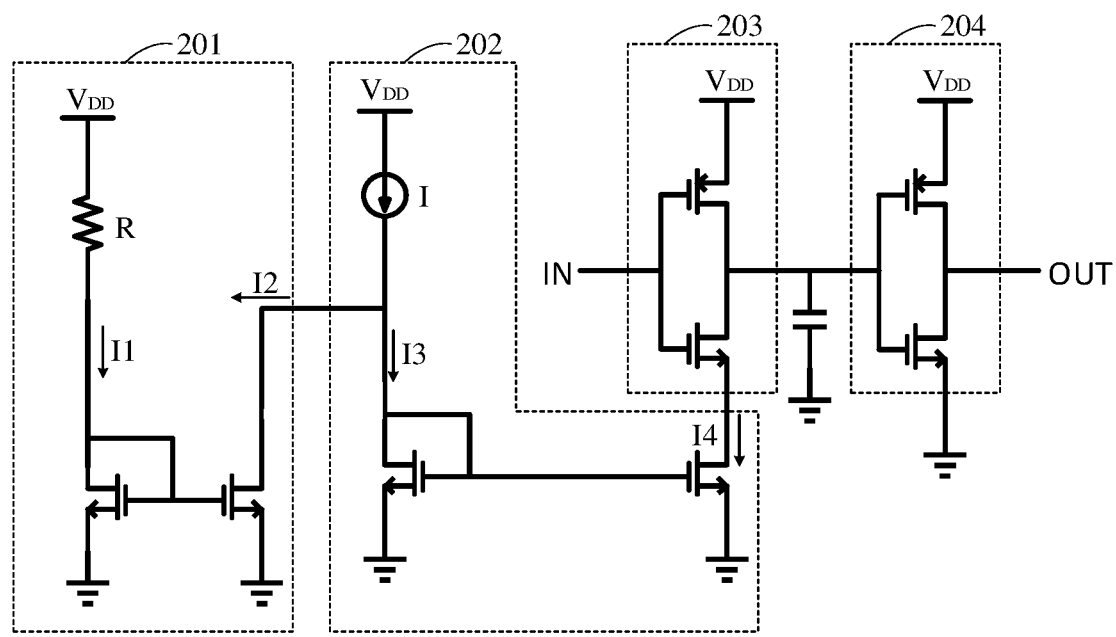
FIG. 3 is a schematic diagram of a circuit structure of a signal delay sub-circuit according to an embodiment of the disclosure.
Figure 4:
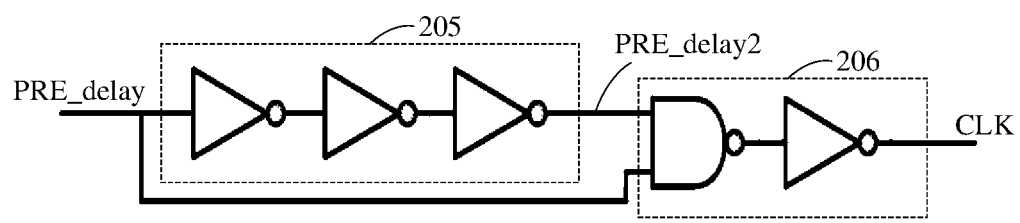
FIG. 4 is a schematic diagram of a circuit structure of a pulse conversion sub-circuit according to an embodiment of the disclosure.
Figure 5:
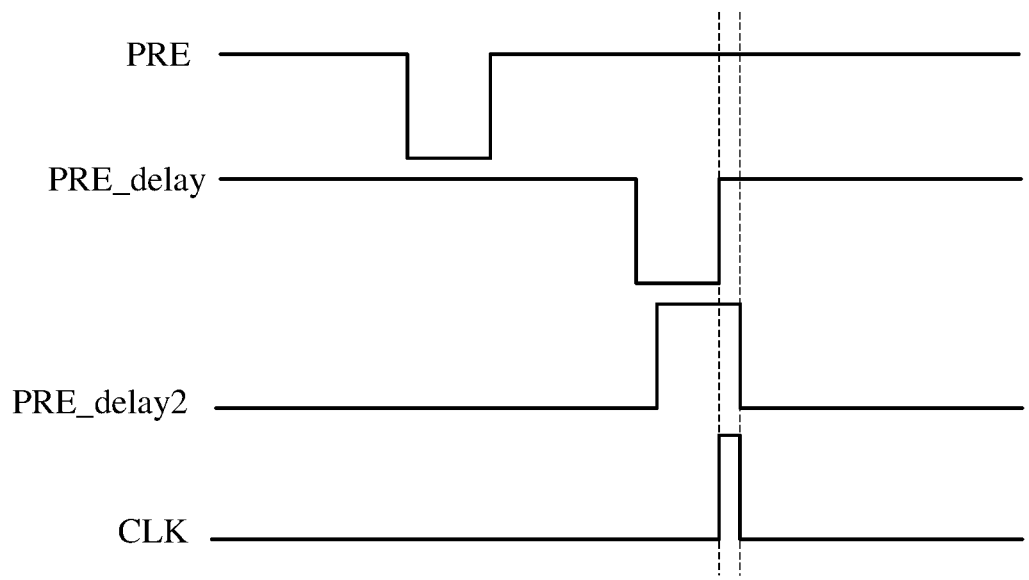
FIG. 5 is a schematic diagram of generating a sampling signal by a pulse conversion sub-circuit according to an embodiment of the disclosure.
Figure 6:
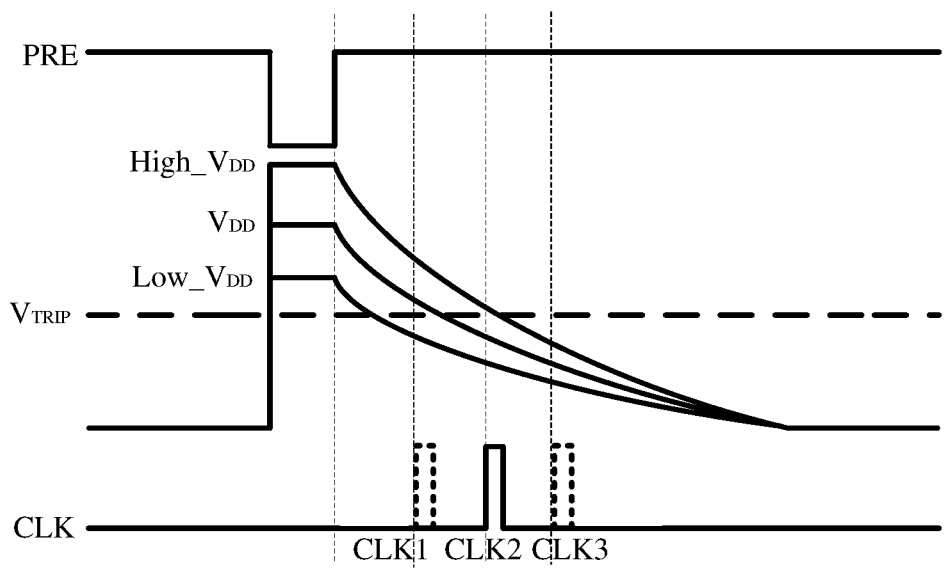
FIG. 6 is a sequence diagram of an anti-fuse memory circuit based on a signal generation circuit under different precharge voltages in a read stage according to an embodiment of the disclosure.
Figure 7:
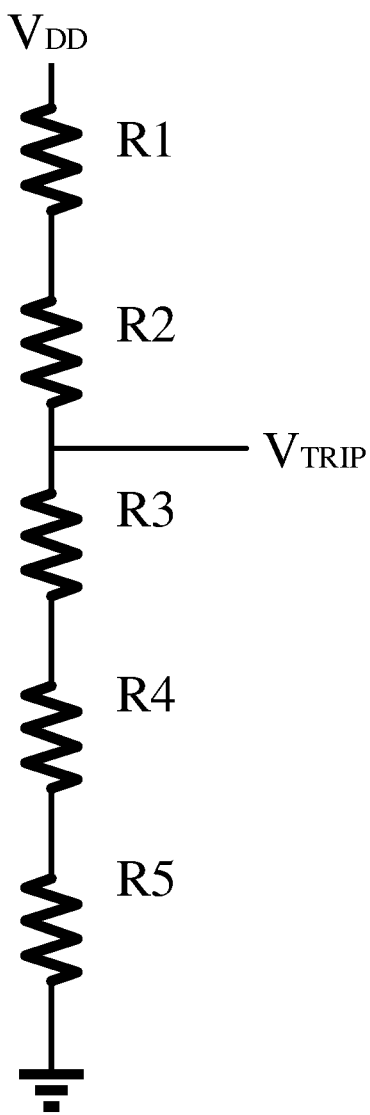
FIG. 7 is a schematic diagram of a circuit structure of a voltage adjustment circuit according to an embodiment of the disclosure.
Figure 8:
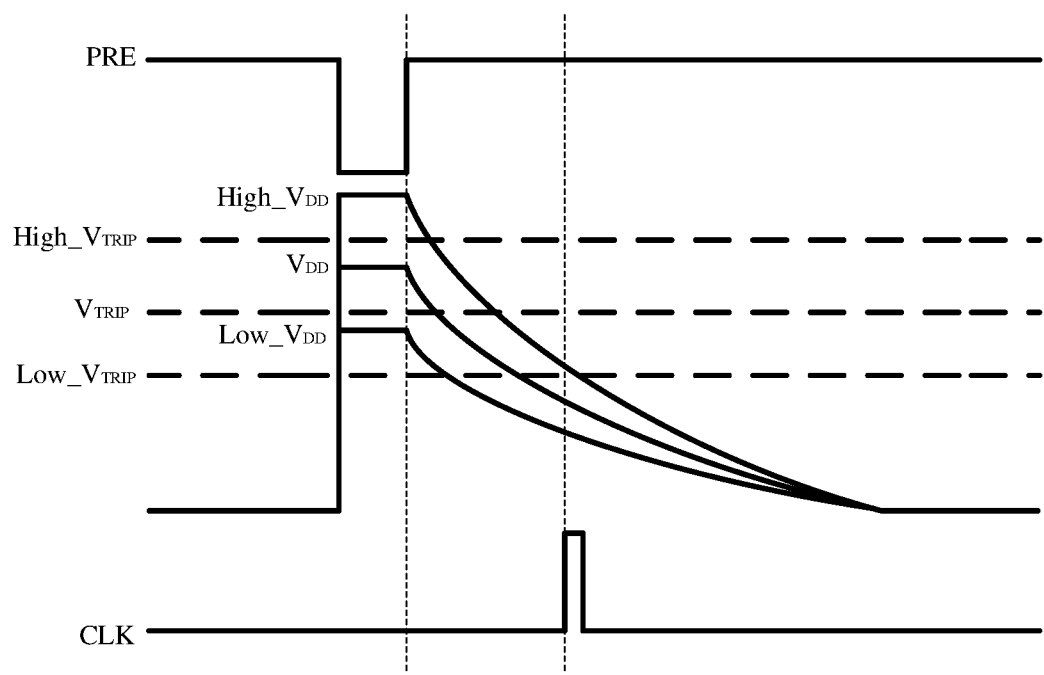
FIG. 8 is a sequence diagram of an anti-fuse memory circuit based on a voltage adjustment circuit under different precharge voltages in a read stage according to an embodiment of the disclosure.

FIG. 1 is a schematic diagram of a circuit structure of an anti-fuse memory circuit according to this embodiment. FIG. 2 is a schematic structural diagram of a signal generation circuit according to this embodiment. FIG. 3 is a schematic diagram of a circuit structure of a signal delay sub-circuit according to this embodiment. FIG. 4 is a schematic diagram of a circuit structure of a pulse conversion sub-circuit according to this embodiment. FIG. 5 is a schematic diagram of generating a sampling signal by a pulse conversion sub-circuit according to this embodiment. FIG. 6 is a sequence diagram of an anti-fuse memory circuit based on a signal generation circuit under different precharge voltages in a read stage according to this embodiment. FIG. 7 is a schematic diagram of a circuit structure of a voltage adjustment circuit according to this embodiment. FIG. 8 is a sequence diagram of an anti-fuse memory circuit based on a voltage adjustment circuit under different precharge voltages in a read stage according to this embodiment. The following further describes the anti-fuse memory circuit provided in this embodiment in detail with reference to the accompanying drawings. Details are as follows.

Referring to FIG. 1, the anti-fuse memory circuit includes a memory array, bit line BLs, word line WLs, a second switch transistor 2Add, a reading circuit 102, and a signal generation circuit 101.

The memory array includes a plurality of anti-fuse memory cells FsBln01 . . . FsBln0$x$, FsBln11 . . . FsBln1$x$, FsBln21 . . . FsBln2$x$, FsBln31 . . . FsBln3$x$. The anti-fuse memory cells represent stored 1-bit data by whether a gate oxide layer is broken down.

It is to be noted that taking an anti-fuse memory cell represented by "FsBln01" as an example, "0" represents a word line 0 connected to the anti-fuse memory cell, and "1" represents a bit line 1 connected to the anti-fuse memory cell. Taking an anti-fuse memory cell represented by "FsBln2$x$" as an example, "2" represents a word line 2 connected to the anti-fuse memory cell, and "x" represents a bit line x connected to the anti-fuse memory cell. In addition, in the descriptions of this embodiment, if there is no number behind the label FsBln, it is indicated that it does not specifically refer to a specific anti-fuse memory cell.

Each of the bit lines BL is connected to the anti-fuse memory cell FsBln arranged in an extension direction of the bit line BL. Each anti-fuse memory cell FsBln is electrically connected to a respective one of the bit lines BL through a first switch transistor 1Add. Specifically, the first switch transistor 1Add includes one of: 1Add01 . . . 1Add0$x$, 1Add11 . . . 1Add1$x$, 1Add21 . . . 1Add2$x$, or 1Add31 . . . 1Add3$x$.

It is to be noted that taking a first switch transistor represented by "1Add01" as an example, "01" represents a connection to the anti-fuse memory cell "FsBln01", that is, the first switch transistor 1Add01 is used as a switch transistor of the anti-fuse memory cell FsBln01. Taking a first switch transistor represented by "1Add2$x$" as an example, "2x" represents a connection to the anti-fuse memory cell "FsBln2$x$", that is, the first switch transistor 1Add2$x$ is used as a switch transistor of the anti-fuse memory cell FsBln2$x$. In addition, in the descriptions of this embodiment, if there is no number behind the label 1Add, it is indicated that it does not specifically refer to a specific first switch transistor.

Each of the word lines WL is connected to the first switch transistors 1Add arranged in an extension direction of the word line WL and is configured to turn on a selected first switch transistor 1Add according to a row strobe signal. The extension direction of the bit line BL and the extension direction of the word line WL are perpendicular to each other. It is to be noted that the row strobe signal is a word line strobe signal, and is used for selecting a target word line WL from a plurality of word lines WL and turning on the first switch transistor 1Add connected to the target word line WL.

Specifically, a gate of the first switch transistor 1Add is connected to the word line WL, one of a source or a drain of the first switch transistor 1Add is connected to the anti-fuse memory cell FsBln, and the other one of the source or the drain is connected to the bit line BL.

In this embodiment, in the extension direction of the bit line BL, every two first switch transistors 1Add are connected to the bit line BL through a same conductive wire. The every two first switch transistors 1Add are connected to the bit line through the same conductive wire, so that the every two first switch transistors 1Add can share a source or a drain in design, thereby reducing a layout area of the anti-fuse memory array or integrating more anti-fuse memory cells in a same area.

The second switch transistor 2Add is configured to connect one of the bit lines BL to a transmission wire 100.

A gate of the second switch transistor 2Add is configured to receive a column strobe signal, one of a source or a drain of the second switch transistor 2Add is connected to the bit line BL, and the other one of the source or drain is connected to the transmission wire 100. The column strobe signal is used for selecting one of the bit lines BL and turning on one second switch transistor 2Add connected to a selected bit line. It is to be noted that the column strobe signal is a bit line strobe signal, and is used for selecting a target bit line BL from a plurality of bit lines BL and turning on the second switch transistor 2Add connected to the target bit line BL.

Specifically, the second switch transistor 2Add includes one of 2Add1 . . . 2Addx.

Taking a second switch transistor represented by "2Add1" as an example, "1" represents a connection to a bit line 1, and the bit line 1 is connected to an anti-fuse memory cell "FsBlnz1" through a first switch transistor "1Addz1", z being any integer of 0-x. Taking a second switch transistor represented by "2Addx" as an example, "x" represents a connection to a bit line x, and the bit line x is connected to an anti-fuse memory cell "FsBlnzx" through a first switch transistor "1Addzx", z being any integer of 0-x. In addition, in the descriptions of this embodiment, if there is no number behind the label 2Add, it is indicated that it does not specifically refers to specific second switch transistor.

The reading circuit 102 includes a first input terminal +, a second input terminal −, and a sampling input terminal C. The first input terminal + is connected to the transmission wire 100, the second input terminal − is configured to receive a reference voltage $V_{TRIP}$, and the sampling input terminal C is configured to receive a sampling signal CLK.

The signal generation circuit 101 is configured to generate the sampling signal CLK according to a precharge voltage $V_{DD}$ and a precharge signal PRE. The precharge signal PRE is used for instructing to precharge the transmission wire 100 to the precharge voltage $V_{DD}$, and a delay duration between the sampling signal CLK and the precharge signal PRE is positively correlated with a voltage amplitude of the precharge voltage $V_{DD}$.

In this embodiment, the anti-fuse memory circuit further includes a precharge MOS transistor. One of a source or a drain of the precharge MOS transistor is configured to receive the precharge voltage $V_{DD}$, the other one of the source or the drain is connected to the transmission wire 100, and a gate of the precharge MOS transistor is configured to receive the precharge signal PRE. The precharge MOS transistor is configured to precharge the transmission wire 100 to the precharge voltage $V_{DD}$ according to the precharge signal PRE.

When the sampling signal CLK is a valid pulse, the reading circuit 102 compares an input voltage V of the first input terminal + with the reference voltage $V_{TRIP}$, to output the 1-bit data stored in the selected anti-fuse memory cell FsBln.

The following takes the anti-fuse memory cells FsBln01 and FsBln11 as an example to describe in detail the working principle of the anti-fuse memory circuit provided in this embodiment. Details are as follows.

In a data programming phase, if a high voltage is applied to the anti-fuse memory cell FsBln01, a gate oxygen medium of the anti-fuse memory cell FsBln01 is broken down, and if a low voltage or no voltage is applied to the anti-fuse memory cell FsBln11, a gate oxygen medium of the anti-fuse memory cell FsBln11 is not broken down.

In this embodiment, the anti-fuse memory circuit further includes a third switch transistor 3Add having one of a source or a drain connected to the transmission wire 100, the other one of the source or the drain grounded, and a gate configured to receive a discharge signal, and the third switch transistor 3Add is configured to discharge an electric charge in the transmission wire 100 according to the discharge signal.

Specifically, in the process of applying the high voltage to the anti-fuse memory cell FsBln01, a first switch transistor 1Add01, a second switch transistor 2Add1, and a third switch transistor 3Add are turned on, and the electric charges in the transmission wire 100 are discharged through the third switch transistor 3Add, to ensure accuracy of data programming of the anti-fuse memory cell FsBln01.

The reading circuit 102 includes a comparator 112 and a latch device 122. The comparator 112 includes the first input terminal +, the second input terminal −, and an output terminal. The latch device 122 includes the sampling input terminal C and a data input terminal D. The data input terminal D is connected to the output terminal of the comparator. The comparator 112 is configured to compare an input voltage V of the first input terminal + with the reference voltage $V_{TRIP}$, and the latch device 122 is configured to output the 1-bit data stored in the anti-fuse memory cell.

In a data reading phase, the third switch transistor 3Add is turned off, and the precharge MOS transistor receives the precharge signal PRE so that the source and the drain are conducted. In this case, the transmission wire 100 is connected to the precharge voltage $V_{DD}$, so as to be precharged to the precharge voltage $V_{DD}$.

When data stored in the anti-fuse memory cell FsBln01 is read, the gate oxygen medium of the anti-fuse memory cell FsBln01 is broken down, and an impedance is extremely small. After the first switch transistor 1Add01 and the second switch transistor 2Add1 are turned on, the electric charges in the transmission wire 100 are discharged through the anti-fuse memory cell FsBln01, so that the input voltage V of the first input terminal + is rapidly pulled down, and the input voltage V of the first input terminal + is less than the reference voltage $V_{TRIP}$. When the received sampling signal CLK is a valid pulse, the reading circuit 102 outputs a low level, and corresponding memory data is "0".

When data stored in the anti-fuse memory cell FsBln11 is read, the gate oxygen medium of the anti-fuse memory cell FsBln11 is not broken down, and an impedance is extremely large. After the first switch transistor 1Add11 and the second switch transistor 2Add1 are turned on, because a discharge rate of the electric charges in the transmission wire 100 through the anti-fuse memory cell FsBln11 is low, the input voltage V of the first input terminal + cannot be rapidly pulled down, so that when the received sampling signal CLK is a valid pulse, the input voltage V of the first input terminal + is still greater than the reference voltage $V_{TRIP}$. In this case, the reading circuit 102 outputs a high level, and corresponding memory data is "1".

It is to be noted that in this embodiment, an example in which the first input terminal serves as a positive phase input terminal of the comparator and the second input terminal serves as a negative phase input terminal of the comparator is merely used for the description of the anti-fuse memory circuit provided in this embodiment. In other embodiments, the transmission wire may be received at the second input terminal, and the reference voltage may be received at the first input terminal. In this case, the gate oxygen medium of the anti-fuse memory cell is broken down. In a reading process, the reading circuit 102 outputs the memory data "0" corresponding to the high level. If the gate oxygen medium of the anti-fuse memory cell is not broken down, in the reading process, the reading circuit 102 outputs the memory data "1" corresponding to the low level. In addition, in this embodiment, the latch device 122 is described by taking a D flip-flop as an example, and is only used for describing the anti-fuse memory circuit provided in this embodiment. In other embodiments, the latch device may be a latch.

In this embodiment, the sampling signal read from the data is no longer a fixed signal, but a delay signal generated based on the precharge signal. There is a delay between the sampling signal and the precharge signal, and a delay size is related to the precharge voltage. If the precharge voltage is larger, the anti-fuse memory cell needs to discharge currents for a long time, and a larger delay is used for ensuring that the anti-fuse memory cell has enough time to discharge currents. If the precharge voltage is smaller, the anti-fuse memory cell needs to discharge currents for a short time, and a smaller delay is used for ensuring that the anti-fuse memory cell can read data more quickly.

Specifically, referring to FIG. 2, the signal generation circuit 101 includes a signal delay sub-circuit 111, configured to receive the precharge signal PRE and delay the precharge signal to output a charging delay signal PRE_delay, and a pulse conversion sub-circuit 121, configured to receive the charging delay signal PRE_delay, generate a pulse signal based on the charging delay signal PRE_delay, and input the pulse signal into the sampling input terminal C as the sampling signal CLK (referring to FIG. 1).

Specifically, referring to FIG. 3, the signal delay sub-circuit 111 includes a first current mirror 201, a second current mirror 202, a first MOS inverter 203, and a second MOS inverter 204.

A first terminal of the first current mirror 201 is connected to the precharge voltage $V_{DD}$ through an input resistor R, and a second terminal of the first current mirror 201 is connected to a first terminal of the second current mirror 202.

The first terminal of the second current mirror 202 is connected to the precharge voltage $V_{DD}$ through a constant current source, and a second terminal of the second current mirror 202 outputs a drive current of the first MOS inverter 203.

An input terminal of the first MOS inverter 203 is configured to receive the precharge signal PRE, and an output terminal of the first MOS inverter 203 is connected to an input terminal of the second MOS inverter 204.

Specifically, the first MOS inverter 203 includes a first NMOS transistor and a first PMOS transistor. A drain of the first NMOS transistor is connected to a drain of the first PMOS transistor and serves as an output terminal of the first MOS inverter, a gate of the first NMOS transistor and a gate of the first PMOS transistor are configured to receive the precharge signal PRE, a source of the first PMOS transistor is configured to receive the precharge voltage $V_{DD}$, and a source of the first NMOS transistor is configured to receive the drive current outputted by the second current mirror 202.

An output terminal of the second MOS inverter 204 is configured to output the charging delay signal PRE_delay. Through the second terminal of the first current mirror, the first current mirror serves as a branch at the first terminal of the second current mirror, so that the larger the precharge voltage connected to the first current mirror is, the smaller the current at the second terminal of the second current mirror is. Further, the current at the second terminal of the second current mirror serves as the drive current of the MOS inverter, so that the larger the drive current is, the smaller a delay of the MOS inverter is; otherwise, the smaller the drive current is, the larger the delay of the MOS inverter is.

In this way, the larger the precharge voltage is, the larger a delay of the generated sampling signal relative to the precharge signal is.

Specifically, the second MOS inverter 204 includes a second NMOS transistor and a second PMOS transistor. A drain of the second NMOS transistor is connected to a drain of the second PMOS transistor and serves as an output terminal of the second MOS inverter, a gate of the second NMOS transistor and a gate of the second PMOS transistor are connected to the drain of the first NMOS transistor, a source of the second PMOS transistor is configured to receive the precharge voltage $V_{DD}$, and a source of the second NMOS transistor is grounded.

Because a current mirror is used for enabling an input current at a first terminal to be equal to an input current at a second terminal. For the first current mirror, a current at the first terminal is $I1=(V_{DD}-V_{D}s)/R$, and a current at the second terminal is $I2=I1$ For the second current mirror, a current at the first terminal is $I3=I-I1$, and a current at the second terminal is $I4=I3=I-(V_{DD}-VDs)/R$. A current I generated by the constant current source is a fixed value, a voltage VDs of a source or a drain of a MOS transistor is equal to a voltage $V_{GS}$ of a gate or a drain and is a fixed value, and the resistor R is a fixed value. It can be known that the drive current I4 of the first MOS inverter 203 is negatively correlated with $V_{DD}$, that is, the larger the $V_{DD}$ is, the smaller I4 is, and the smaller the $V_{DD}$ is, the larger the I4 is.

For a MOS inverter, the larger a drive current is, the smaller a signal inverse delay is, and the smaller the drive current is, the larger the signal inverse delay is. It can be known that a delay of the charging delay signal PRE_delay generated after the first MOS inverter 203 and the second MOS inverter 204 delay the precharge signal PRE is positively correlated with the precharge voltage $V_{DD}$. That is, the larger the $V_{DD}$ is, the larger the delay of the charging delay signal PRE_delay relative to the precharge signal PRE is, and the smaller $V_{DD}$ is, the smaller the delay of the charging delay signal PRE_delay relative to the precharge signal PRE is.

Referring to FIG. 4, the pulse conversion sub-circuit 121 includes an inverter circuit 205 and an AND gate 206.

The inverter circuit 205 includes an odd number of stages of inverters connected in series, and has an input terminal configured to receive the charging delay signal PRE_delay.

The AND gate 206 has an input terminal connected to an output terminal of the inverter circuit 205, and another input terminal configured to receive the charging delay signal PRE_delay, and is configured to generate a pulse signal, i.e., the sampling signal CLK, according to the charging delay signal PRE_delay and the charging delay signal PRE_delay2 that is delayed by the inverter circuit 205.

The AND gate 206 in the drawings is formed through an NAND gate and an inverter, on the grounds that a logic gate generally integrated in a chip is an NAND gate. In other embodiments, a logic gate structure of an AND gate may be directly used for replacing a connection structure of the NAND gate and the inverter shown in FIG. 4.

In this embodiment, the odd number of stages of inverters connected in series are three inverters connected in series. It is to be noted that in other embodiments, the odd number of stages of inverters connected in series are one inverter, five inverters, or the like.

Referring to FIG. 5, the signal delay sub-circuit 111 generates the charging delay signal PRE_delay after the precharge signal PRE is delayed. A signal PRE_delay2 obtained after an odd number of inverters in the pulse conversion sub-circuit 121 perform phase reversal and slight delay on the charging delay signal PRE_delay is staggered partially with a square-wave of the charging delay signal PRE_delay. In this case, a pulse, i.e., the sampling signal CLK, is generated at a same height of the staggered square wave after the AND gate 206 is passed through.

Referring to FIG. 6, when the precharge voltage $V_{DD}$ is normal, a sampling signal CLK2 is generated according to the precharge signal PRE. When the precharge voltage $V_{DD}$ is a high voltage, a sampling signal CLK3 is generated according to the precharge signal PRE, that is, the valid pulse of the sampling signal is moved backward, to ensure that the anti-fuse memory cell FsBln has enough time to discharge the electric charges in the transmission wire 100 after being precharged to a higher voltage. When the precharge voltage $V_{DD}$ is a low voltage, a sampling signal CLK1 is generated based on the precharge signal PRE, that is, the valid pulse of the sampling signal is moved forward, to ensure that the anti-fuse memory cell FsBln can read data more quickly.

In another example, referring to FIG. 7, the anti-fuse memory circuit further includes a voltage adjustment circuit including a voltage division circuit having a plurality of resistors connected in series. One terminal of the voltage division circuit is configured to receive the precharge voltage $V_{DD}$, and the other terminal of the voltage division circuit is grounded, and the voltage division circuit is configured to generate the reference voltage $V_{TRIP}$ by dividing the precharge voltage $V_{DD}$, and input the reference voltage to the second input terminal −.

In this embodiment, a plurality of voltage division resistors connected in series are respectively R1, R2, R3, R4, and R5. (R3+R4+R5)/(R1+R2+R3+R4+R5)=60%-80%, to ensure that the generated reference voltage $V_{TRIP}$ is 60%-80% of the precharge voltage $V_{DD}$. In other embodiments, a person skilled in the art may set a percentage between the reference voltage $V_{TRIP}$ and the precharge voltage $V_{DD}$ according to the specific required reference voltage $V_{TRIP}$.

The voltage adjustment circuit adjusts the reference voltage $V_{TRIP}$ based on the precharge voltage $V_{DD}$, to further ensure the accuracy of data read from an anti-fuse memory.

In other embodiments, only the voltage adjustment circuit is used and the signal generation circuit is discarded, to ensure the accuracy of data read from the anti-fuse memory. Referring to FIG. 8, when the voltage adjustment circuit is available, the generated reference voltage $V_{TRIP}$ fluctuates with the precharge voltage $V_{DD}$. When the precharge voltage $V_{DD}$ increases, the reference voltage $V_{TRIP}$ also increases, so that when the valid pulse of the sampling signal CLK is achieved, the anti-fuse memory cell FsBln has enough time to discharge the electric charges in the transmission wire 100, and a voltage on the transmission wire 100 decreases to the reference voltage $V_{TRIP}$. When the precharge voltage $V_{DD}$ decreases, the reference voltage $V_{TRIP}$ also decreases, so that it is ensured that when the valid pulse of the sampling signal CLK is achieved, the anti-fuse memory cell FsBln has enough time to discharge the electric charges in the transmission wire 100, and the voltage on the transmission wire 100 decreases to the reference voltage $V_{TRIP}$ Still referring to FIG. 1, in this embodiment, the anti-fuse memory circuit further includes a capacitor Cap for voltage stabilization, having an electrode plate on one side connected to the transmission wire 100, and an electrode plate on the other side grounded and configured to stabilize a voltage of the transmission wire 100, to prevent a voltage of the transmission wire 100 from jumping.

Compared with the related art, the sampling signal read from the data is no longer a fixed signal, but a delay signal generated based on the precharge signal. There is a delay between the sampling signal and the precharge signal, and a delay size is related to the precharge voltage. If the precharge voltage is larger, the anti-fuse memory cell needs to discharge currents for a long time, and a larger delay is used for ensuring that the anti-fuse memory cell has enough time to discharge currents. If the precharge voltage is smaller, the anti-fuse memory cell needs to discharge currents for a short time, and a smaller delay is used for ensuring that the anti-fuse memory cell can read data more quickly. The delay size of generating the sampling signal based on the precharge signal is flexibly set, so that the accuracy of data read from an anti-fuse memory is ensured, and a speed of reading data from the anti-fuse memory is ensured.

It is worth mentioning that, all sub-circuits involved in this embodiment are logical sub-circuits. In actual application, one logical sub-circuit may be one physical sub-circuit or a part of one physical sub-circuit, or may be implemented by a combination of a plurality of physical sub-circuits. In addition, to highlight the innovative part of the disclosure, a sub-circuit that is not closely related to resolving the technical problem proposed in the disclosure is not introduced in this embodiment, but it does not indicate that no other sub-circuit exists in this embodiment.

A person of ordinary skill in the art can understand that the foregoing embodiments are specific embodiments for implementing the disclosure. In actual application, various forms and details can be changed without departing from the spirit and scope of the disclosure.

INDUSTRIAL APPLICABILITY

In the embodiments of the disclosure, an anti-fuse memory circuit includes: a memory array, including a plurality of anti-fuse memory cells; bit lines, each of which is connected to the anti-fuse memory cells arranged in an extension direction of the bit line, each anti-fuse memory cell being electrically connected to a respective one of the bit lines through a first switch transistor; word lines, each of which is connected to the first switch transistors arranged in an extension direction of the word line; a second switch transistor, configured to connect one of the bit lines to a transmission wire; a reading circuit, having a first input terminal connected to the transmission wire, a second input terminal configured to receive a reference voltage, and a sampling input terminal configured to receive a sampling signal; and a signal generation circuit, configured to generate the sampling signal according to a precharge voltage and a precharge signal. The precharge signal is used for instructing to precharge the transmission wire to the precharge voltage, and a delay duration between the sampling signal and the precharge signal is positively correlated with a voltage amplitude of the precharge voltage, to ensure that when the precharge voltage is larger, the anti-fuse memory cell has enough time to discharge currents, thereby ensuring accuracy of reading data.

The invention claimed is:
1. An anti-fuse memory circuit, comprising:
   a memory array, comprising a plurality of anti-fuse memory cells, the anti-fuse memory cell representing stored 1-bit data by whether a gate oxide layer is broken down;
   bit lines, each of which is connected to the anti-fuse memory cells arranged in an extension direction of the bit line, each anti-fuse memory cell being electrically connected to a respective one of the bit lines through a first switch transistor;

word lines, each of which is connected to the first switch transistors arranged in an extension direction of the word line and configured to turn on a selected first switch transistor according to a row strobe signal, wherein the extension direction of the bit line and the extension direction of the word line are perpendicular to each other;

a second switch transistor, configured to connect one of the bit lines to a transmission wire;

a reading circuit, comprising a first input terminal, a second input terminal and a sampling input terminal, wherein the first input terminal is connected to the transmission wire, the second input terminal is configured to receive a reference voltage, and the sampling input terminal is configured to receive a sampling signal; and a signal generation circuit, configured to generate the sampling signal according to a precharge voltage and a precharge signal, wherein the precharge signal is used for instructing to precharge the transmission wire to the precharge voltage, and a delay duration between the sampling signal and the precharge signal is positively correlated with a voltage amplitude of the precharge voltage, wherein when the sampling signal is a valid pulse, the reading circuit compares an input voltage of the first input terminal with the reference voltage, to output the 1-bit data stored in the anti-fuse memory cell.

2. The anti-fuse memory circuit of claim 1, wherein the reading circuit comprises:

a comparator, comprising the first input terminal, the second input terminal, and an output terminal; and a latch device, comprising the sampling input terminal and a data input terminal, wherein the data input terminal is connected to the output terminal of the comparator, wherein the comparator is configured to compare the input voltage of the first input terminal with the reference voltage, and the latch device is configured to output the 1-bit data stored in the anti-fuse memory cell.

3. The anti-fuse memory circuit of claim 2, wherein the signal generation circuit comprises:

a signal delay sub-circuit, configured to: receive the precharge signal, and delay the precharge signal to output a charging delay signal; and a pulse conversion sub-circuit, configured to: receive the charging delay signal, generate a pulse signal based on the charging delay signal, and input the pulse signal into the sampling input terminal as the sampling signal.

4. The anti-fuse memory circuit of claim 3, wherein the signal delay sub-circuit comprises a first current mirror, a second current mirror, a first Metal-Oxide-Semiconductor (MOS) inverter, and a second MOS inverter, wherein a first terminal of the first current mirror is connected to the precharge voltage through an input resistor, and a second terminal of the first current mirror is connected to a first terminal of the second current mirror;

the first terminal of the second current mirror is connected to the precharge voltage through a constant current source, and a second terminal of the second current mirror outputs a drive current of the first MOS inverter;

an input terminal of the first MOS inverter is configured to receive the precharge signal, and an output terminal of the first MOS inverter is connected to an input terminal of the second MOS inverter; and an output terminal of the second MOS inverter is configured to output the charging delay signal.

5. The anti-fuse memory circuit of claim 4, wherein:

the first MOS inverter comprises a first Negative-channel MOS (NMOS) transistor and a first Positive-channel MOS (PMOS) transistor, a drain of the first NMOS transistor being connected to a drain of the first PMOS transistor, wherein a gate of the first NMOS transistor and a gate of the first PMOS transistor are configured to receive the precharge signal, a source of the first PMOS transistor is configured to receive the precharge voltage, and a source of the first NMOS transistor is configured to receive the drive current outputted by the second current mirror; and the second MOS inverter comprises a second NMOS transistor and a second PMOS transistor, a drain of the second NMOS transistor being connected to a drain of the second PMOS transistor, wherein a gate of the second NMOS transistor and a gate of the second PMOS transistor are connected to the drain of the first NMOS transistor, a source of the second PMOS transistor is configured to receive the precharge voltage, and a source of the second NMOS transistor is grounded.

6. The anti-fuse memory circuit of claim 3, wherein the pulse conversion sub-circuit comprises:

an inverter circuit, comprising an odd number of stages of inverters connected in series, and having an input terminal configured to receive the charging delay signal; and an AND gate, having an input terminal connected to an output terminal of the inverter circuit and another input terminal configured to receive the charging delay signal, and configured to generate the pulse signal according to the charging delay signal and the charging delay signal that is delayed by the inverter circuit.

7. The anti-fuse memory circuit of claim 6, wherein the odd number of stages of inverters connected in series are three inverters connected in series.

8. The anti-fuse memory circuit of claim 1, further comprising: a voltage adjustment circuit comprising a voltage division circuit having a plurality of resistors connected in series, one terminal of the voltage division circuit being configured to receive the precharge voltage, and the other terminal of the voltage division circuit being grounded, and the voltage division circuit being configured to generate the reference voltage by dividing the precharge voltage, and input the reference voltage to the second input terminal.

9. The anti-fuse memory circuit of claim 8, wherein the reference voltage is 60%-80% of the precharge voltage.

10. The anti-fuse memory circuit of claim 1, wherein a gate of the first switch transistor is connected to the word line, one of a source or a drain of the first switch transistor is connected to the anti-fuse memory cell, and the other one of the source or drain is connected to the bit line.

11. The anti-fuse memory circuit of claim 10, wherein in the extension direction of the bit line, every two first switch transistors are connected to the bit line through a same conductive wire.

12. The anti-fuse memory circuit of claim 1, wherein a gate of the second switch transistor is configured to receive a column strobe signal, one of a source or a drain of the second switch transistor is connected to the bit line, and the other one of the source or drain is connected to the transmission wire, wherein the column strobe signal is used for selecting one of the bit lines and turning on one second switch transistor connected to a selected bit line.

13. The anti-fuse memory circuit of claim 1, further comprising a precharge MOS transistor having one of a source or a drain configured to receive the precharge voltage, the other one of the source or the drain connected to the transmission wire, and a gate configured to receive the precharge signal; wherein the precharge MOS transistor is configured to precharge the transmission wire to the precharge voltage according to the precharge signal.

14. The anti-fuse memory circuit of claim 1, further comprising a third switch transistor having one of a source or a drain connected to the transmission wire, the other of the source or the drain grounded, and a gate configured to receive a discharge signal; wherein the third switch transistor is configured to discharge an electric charge in the transmission wire according to the discharge signal.

15. The anti-fuse memory circuit of claim 1, further comprising a capacitor for voltage stabilization, having an electrode plate on one side connected to the transmission wire, and an electrode plate on the other side grounded, wherein the capacitor for voltage stabilization is configured to stabilize a voltage of the transmission wire.

\* \* \* \* \*